United States Patent [19]

Brooks

[11] Patent Number: 4,808,473
[45] Date of Patent: * Feb. 28, 1989

[54] POLYAMIDE-IMIDE AROMATIC SULFONE POLYMER FILMS

[75] Inventor: Gary T. Brooks, Naperville, Ill.

[73] Assignee: Amoco Corporation, Chicago, Ill.

[*] Notice: The portion of the term of this patent subsequent to Apr. 8, 2003 has been disclaimed.

[21] Appl. No.: 58,188

[22] Filed: Jun. 4, 1987

Related U.S. Application Data

[63] Continuation of Ser. No. 787,252, Oct. 15, 1985, abandoned, which is a continuation of Ser. No. 595,276, Mar. 30, 1984, abandoned.

[51] Int. Cl.$^4$ .......................... B32B 5/16; B22B 27/00
[52] U.S. Cl. ...................................... 428/336; 428/337; 428/339; 428/473.5; 264/171; 264/331.12; 525/420
[58] Field of Search ...................... 428/473.5, 336, 337, 428/339; 525/420; 264/171, 331.12

[56] References Cited

U.S. PATENT DOCUMENTS

| | | | |
|---|---|---|---|
| 3,993,825 | 11/1976 | Buchan et al. | 428/473.5 |
| 4,189,518 | 2/1980 | Peterson | 428/473.5 |
| 4,340,697 | 7/1982 | Aya et al. | 525/420 |
| 4,581,264 | 8/1986 | Emory et al. | 428/36 |

*Primary Examiner*—John C. Bleutge
*Assistant Examiner*—A. Carrillo
*Attorney, Agent, or Firm*—Stephen L. Hensley; William H. Magidson; Ralph C. Medhurst

[57] ABSTRACT

Films having a thickness of about 0.5 to about 10 mils comprising about 0.1 to about 50 weight percent of aromatic sulfone polymers and about 99.9 to about 50 percent by weight of polyamide-imides are disclosed.

The films are useful in those high temperature applications which require a specimen of 10 mils or less. The alloy film can also be used in the electrical/electronic field in such applications as flexible circuit boards. The alloy film can also be die punched into high temperature spacers and washers which cannot be injection molded due to their thin cross-section.

12 Claims, No Drawings

POLYAMIDE-IMIDE AROMATIC SULFONE POLYMER FILMS

This is a continuation of application Ser. No. 787,252, filed Oct. 15, 1985, which in turn is a continuation of Ser. No. 595,276 filed Mar. 30, 1984, both now abandoned.

FIELD OF THE INVENTION

The field of this invention relates to polyamide-imide aromatic sulfone polymer films.

BACKGROUND

Polyamide-imide (PAI) polymers and copolymers are a relatively new class of organic compounds known for their solubility in nitrogen containing organic solvents when in the largely polyamide form. In the past, the major application of these amide-imide polymers has been as wire enamels. This is illustrated in U.S. Pat. Nos. 3,661,832 (1972), 3,494,890 (1970) and 3,347,828 (1967). Amide-imide polymers and copolymers have also been found useful for molding applications as shown in U.S. Pat. Nos. 4,016,140 (1977) and 3,573,260 (1971). U.S. Pat. No. 4,136,085 (1979), U.S. Pat. No. 4,313,868 (1982), and U.S. Pat. No. 4,309,528 (1982) are incorporated herein by reference. These polyamides are known for their outstanding mechanical properties, but they are also difficult to process, particularly to prepare thin films having a thickness from about 0.5 to about 10 mils. This difficulty is a consequence of insufficient flow and lack of melt ductility of the polymer. The art has been looking for improvements in the flow during fabrication of the polymers as shown in U.S. Pat. No. 4,340,697, but it is essential that an additive not impair the excellent curing and mechanical properties of the polyamide-imide polymers and copolymers, particularly the flexural and heat deflection properties, which are formed via curing the amide-imide at temperatures up to and above 500° F. The ideal flow improving agent for these polymers would be one which plasticizes the polymers during film extrusion and crosslinks the polymers and copolymers during the curing or annealing step so that the plasticizing effect would be neutralized by cross-linking.

The general object of this invention is to provide polyamide-imide aromatic sulfone polymer films. A more specific object of this invention is to provide polyamide-imide polyethersulfone (PES) films having a thickness of about 0.5 to about 10 mils. Films above 10 mils are considered ribbon or sheet. Ribbons and sheets above 10 mils can easily be fabricated with the polyamide-imide polyethersulfone (PAI/PES) blends. Sheets as thick as 100 mils have been made from PAI/PES blends but the 100 mil thickness should not be understood as being the upper limit of this invention. The PAI polymer flow and melt ductility are improved by the addition of about 0.1 to about 50 percent by weight of aromatic polysulfone. However, the preferred blending range is between about 10 to about 30% by weight of an aromatic sulfone polymer. The preferred aromatic sulfone polymer is polyethersulfone. However, other aromatic polysulfone polymers, such as polyarylsulfone (Radel) and polysulfone (Udel), both commerically available through Union Carbide, are useful additives for extruding PAI into thin film. Other objects appear hereinafter.

I have now found that amide-imide polymers and copolymers obtained by reacting a polycarboxylic acid anhydride with one primary diamine or a mixture of primary diamines containing about 0.1 to about 50 percent by weight of an aromatic sulfone polymer have excellent flow properties and improve melt ductility and readily form films having a thickness of about 0.5 to about 10 mils. Polyethersulfones have also been found to aid the manufacture of amide-imide impregnated graphite woven fiber laminates. Suitable aromatic sulfone polymers have both the ether and the —SO$_2$— linkage. Advantageously, the aromatic polysulfone comprises recurring units of the following structure:

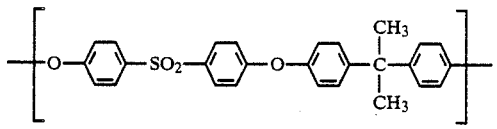

Udel P-1700

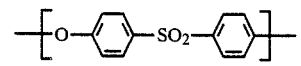

("Polyether-sulfone Victrex" manufactured by ICI)

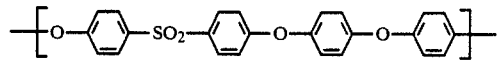

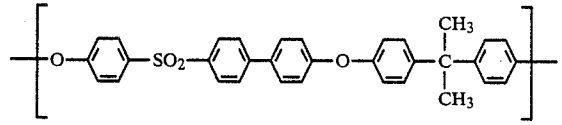

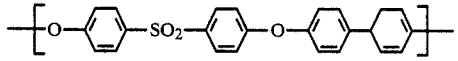

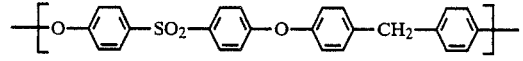

These aromatic polysulfones are easily manufactured by the methods disclosed, for example, in Japanese Patent Application Publication No. 7799/1967 and Japanese Patent Application Publication No. 617/1972, and one and/or not less than two kinds of them may be optionally selected in accordance with the desired melt blend.

Polyethersulfones are made commercially available by ICI as Victrex polymers. There are at least three grades of PES available which vary in molecular weight. Any of the grades are acceptable. However, the highest M.W. grade is preferred (Victrex 600P).

The amount of the aromatic polysulfone added to the amide-imide polymer can be about 0.1 to about 50 weight percent, usually in the range of about 10 to about 30 weight percent. When about 10 to about 30 weight percent of the polyethersulfone was dry blended with our amide-imide polymer, excellent films of about 0.5 to about 10 mils in thickness were prepared. The polyethersulfones improve the melt ductility of our amide-imide polymer melt while allowing solid state polymerization during post cure. Thus, with these polyethersulfone/polyamide-imide blends, excellent post cure can be carried out and it is during this post cure that the excellent physical and thermal properties of our amide-imide films containing aromatic polysulfones are obtained.

Since polyamide-imides must be cured at temperatures up to and above 500° F., it is important that the blend can withstand these cure temperatures without stress relaxing or distorting. In an amide-imide miscible alloy where a single blend glass transition temperature (Tg) is formed, only a 25° F. to 50° F. drop in Tg is allowed during blending. A larger drop in Tg would result in a product which could not be adequately or economically cured. This Tg constraint along with the substantially lower secondary polymer Tg makes blend miscibility not always desirable, especially if high loadings of a secondary polymer are needed to improve the workability of the amide-imide. In an ideal amide-imide alloy, the secondary polymer should have a Tg close to the amide-imide, while being significantly less viscous and similar enough in structure and/or polarity to be compatible with the amide-imide molecules.

To determine if the PAI, described in U.S. Pat. Nos. 4,136,085 and 4,313,868, are miscible with PES (single blend Tg) an Omnitherm QC25 differential scanning calorimeter, scanning at 20° C./minute, was used. 80/20, 70/30, and 50/50 blends of PAI/PES have two separate glass transition temperatures (Tg), one for the PES components (~222° C.) and one for the PAI component (~260° C.). A completely miscible system would exhibit a single Tg, while a partly miscible blend would have two Tg's. For a partly miscible blend, the Tg's may be broadened and shifted in temperature from those of the pure components. The polyamide-imide/polyethersulfone blends show no evidence of a system which is miscible. Immiscible blends have two Tg's, each at the temperature of one of the pure components. This is the case with the polyamide-imide/polyethersulfone blends. Although the polyamide-imide/polyethersulfone materials are not miscible, they exhibit excellent blend homogeneity, where the majority of separate polymer domains are less than 0.5 micron. The excellent homogeneity within an immiscible blend suggests that these materials have enough molecular attraction to be compatible since it would take an order of magnitude of mixing above that of a conventional extruder to get this level of polymer dispersion in an immiscible, incompatible blend. To determine the blend homogeneity, samples were analyzed for sulfur (PES component) using the Scanning Electron Microscope-Energy Dispersive X-ray Analyses (SEM-EDAX) at magnifications up to 22,000X. The blends of PAI and PES do not delaminate or fibrilate, again indicating a compatible blend.

The addition of a polysulfone or a polyarylsulfone to a polyamide-imide produces a blend with separate pure component Tg's. However, the addition of polysulfone (Udel P1700) to an amide-imide does not result in the same level of polymer-polymer homogeneity as seen with the PAI/PES blend. The polyamide-imide/polysulfone blends (80/20 and 70/30) have large polymer-rich domains of polysulfone and polyamide-imide unlike the polyamide-imide/polyethersulfone blends. This suggests that differences do exist among various polyamide-imide/aromatic sulfone polymer blends which are not predictable by conventional thermal analysis (blend Tg). The PES used in the SEM experiments was Victrex 600P, which has a much higher melt viscosity than the polysulfone (Udel P1700). The viscosity differences would favor mixing in the polyamide-imide/polysulfone blend. Extruded films can be made from polyamide-imide/polysulfone or polyamide-imide/polyarylsulfone. However, the preferred film is a polyamide-imide/polyethersulfone blend. The ideal films are made from polyamide-imide/polyethersulfone blends where the polyethersulfone is Victrex 600P, the highest commercially available molecular weight polyethersulfone supplied by ICI.

More importantly, we have found that the addition of polyethersulfone affects various polyamide-imides differently, especially their physical property response, and the effect is dependent upon which polyamide-imide formulation is used in the blend. When polyamide-imide blends are prepared via the process described in U.S. Pat. No. 4,313,868, and alloyed with polyethersulfone, tensile strength properties of the blend are synergistic where the strength of the alloy is greater than either of the pure polymer components. The novelty of our polyamide-imide polyethersulfone films is partly dependent on the synergistic effect which is produced when polyethersulfones are added to the polyamide-imide. When polyamide-imides are prepared via the process described in U.S. Pat. No. 4,136,085 and alloyed with the same polyethersulfone, tensile strength properties of the blend follow an additive trend, which can be estimated by the laws of mixtures, where the blend properties fall between the properties of the pure polymer components. This difference in property response between the polyamide-imides alloyed with polyethersulfone illustrates that not all amide-imide behave the same when blended with the same secondary polymer components. The difference in property response of the two polyamide-imide/polyethersulfone alloys are reported in Table 2.

To further illustrate the difference between the polyamide-imides alloyed with the same polyethersulfone, one can compare the homogeneity of these alloys. Similar alloy concentrations were examined with a Phillips 501 SEM at powers of up to 12,500X. Polyamide-imides prepared via the process described in U.S. Pat. No. 4,313,868 and alloyed with 20 percent by polymer weight of Victrex 600P (polyethersulfone) have PES phase domains ranging in size from about 1 $\mu$m to about 0.8 $\mu$m. The morphology of a 70/30 blend of the same constituents is different than the 80/20 blend. In the 70/30 blend, the PES phase is continuously surrounding large polyamide-imide domains. Some of the polyamide-imide domains are isolated while many continue into their neighboring domains. The polyamide-imide phase also contains small isolated domains of PES.

Polyamide-imide prepared via the process described in U.S. Pat. No. 4,136,085 and alloyed with 50 percent by polymer weight of Victrex 600P (polyethersulfone) have two distinct phases. The PES phase is a continuous matrix surrounding the PAI phase. In general, the polyamide-imide domains range in size from about ¼ $\mu$m to more than 1 $\mu$m. Distinct domains of PAI and PES are not as apparent in the 80/20 or 70/30 blends as they are in the 50/50 blend of PAI & PES. As the concentration of PES in the blend increases, so does the density of sulfur in the electron dot map (EDM). In the case of the 80/20 and 70/30 blends, some areas of the EDM are devoid of sulfur. This suggests areas of pure polyamide-imide domains. The remaining area on the EDM is covered fairly uniformly with evidence of sulfur. This entire area could not be pure PES since it covers much more than 20% or 30% of the surface. The balance of the area then contains both polyamide-imide and polyethersulfone. The texture hints that small domains of polyamide-imide may exist in a thin cluster of more ductile PES. This further suggests that the domains are smaller than ⅓ μm.

The level and degree of homogeneity within these blends may possibly explain the difference in the property response between the two different polyamide-imide based polyethersulfone blends. Whatever the reason for the difference in property response of these alloys, it is evident that polyamide-imide prepared from different monomers act differently when alloyed with the same polyethersulfone.

The stabilized polyamide-imides, alloyed with an aromatic sulfone polymer of this invention, are prepared by reacting an acyl halide derivative of an aromatic tricarboxylic-acid-anhydride with one or a mixture of largely- or wholly-aromatic primary diamines. The resulting products are polyamides wherein the linking groups are predominantly amide groups, although some may be imide groups, and wherein the structure contains free carboxylic acid groups which are capable of further reaction. Such polyamides are moderate molecular weight (7–13,000 as prepared) polymeric compounds having, in their molecule, units of:

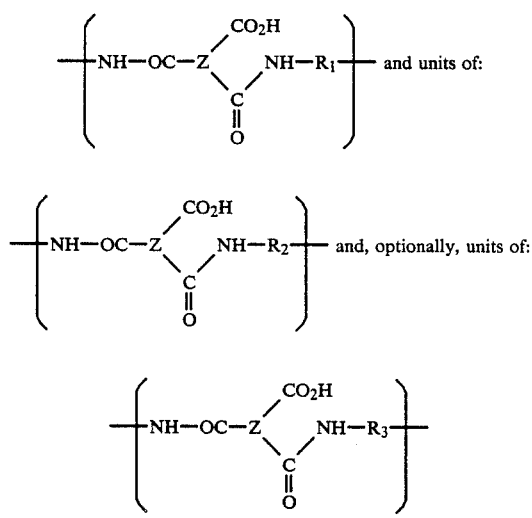

wherein the free carboxyl groups are ortho to one amide group, Z is an aromatic moiety containing 1 to 4 benzene rings or lower-alkyl-substituted benzene rings; $R_1$, $R_2$ and $R_3$ are the same for homopolymers and are different for copolymers and are divalent wholly- or largely-aromatic hydrocarbon radicals. These hydrocarbon radicals may be divalent aromatic hydrocarbon radicals of from about 6 to about 10 carbon atoms, or two divalent aromatic hydrocarbon radicals each of from about 6 to about 10 carbon atoms joined directly or by stable linkages such as —O—, methylene, —CO—, —SO$_2$—, —S—; for example, —R'—O—R'—, —R'—CH$_2$—R'—, —R'—CO—R'—, —R'—SO$_2$—R'— and —R'—S—R'—.

Said polyamides are capable of substantially complete imidization by heating, by which they form the polyamide-imide structure having, to a substantial extent, recurring units of:

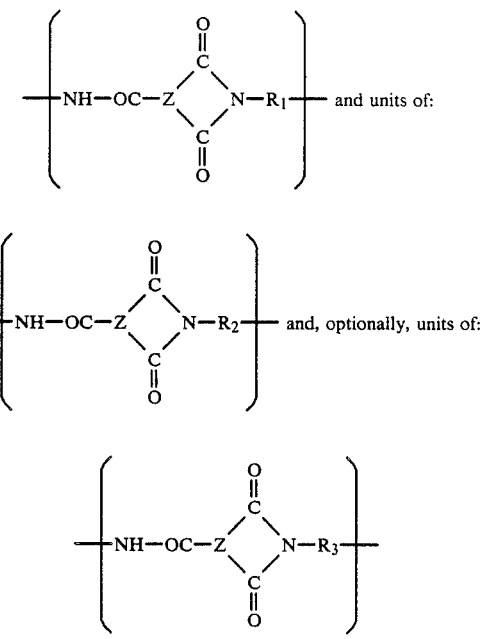

wherein one carbonyl group is meta to and one carbonyl group is para to each amide group and wherein Z, $R_1$, $R_2$ and $R_3$ are defined as above. Typical copolymers of this invention have up to about 50 percent imidization prior to heat treatment, typically about 10 to about 40 percent. In the foregoing polyamide and polyamide-imide moieties, the $R_1$ and $R_2$ containing units run from about 10 mole percent $R_1$ containing unit and about 90 mole percent $R_2$ containing unit to about 90 mole percent $R_1$ containing unit to about 10 mole percent $R_2$ containing unit.

The polyamide-imide copolymers are prepared from an anhydride-containing substance and a mixture of wholly- or partially-aromatic primary diamines or fully or partially acylated diamines. The process using acylated diamines is disclosed in U.S. Pat. No. 4,309,528 incorporated herein by reference. Usefully, the anhydride-containing substance is an acyl halide derivative of the anhydride of an aromatic tricarboxylic acid which contains about 1 to about 4 benzene or lower-alkyl-substituted benzene rings and wherein two of the carboxyl groups are ortho to one another. More preferably, the anhydride-containing substance is an acyl halide derivative of an acid anhydride having a single benzene or lower-alkyl-substituted benzene ring, and most preferably, the substance is the acyl chloride derivative of trimellitic acid anhydride (4-TMAC).

We can use a single diamine, but usefully the mixture of diamines, contains two or more, preferably two or three, wholly- or largely-aromatic primary diamines. More particularly, they are wholly- or largely-aromatic primary diamines containing from about 6 to about 10 carbon atoms or wholly- or largely-aromatic primary diamines composed of two divalent aromatic moieties of from about 6 to about 10 carbon atoms, each moiety containing one primary amine group, and the moieties linked directly or through, for example, a bridging —O—, —S—, —SO$_2$—, —CO—, or methylene group. When three diamines are used, they are preferably selected from the class composed of:

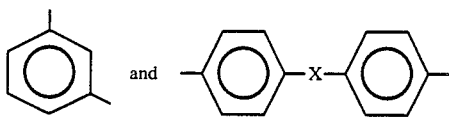

said X being an —O—, —CH$_2$—, or —SO$_2$— group. More preferably, the mixture of aromatic primary diamines is in the one-component or two-component system and is composed of meta-phenylenediamine and p,p'-oxybis(aniline) and meta-phenylenediamine, or p,p'-sulfonylbis(aniline) and p,p'-methylenebis(aniline). Most preferably, the mixture of primary aromatic diamines contains meta-phenylenediamine and p,p'-oxybis(aniline). In the one-component system the preferred diamines are oxybis(aniline) or meta-phenylenediamine. The aromatic nature of the diamines provides the excellent thermal properties of the homopolymer and copolymers while the primary amine groups permit the desired imide rings and amide linkages to be formed.

Usually the polymerization or copolymerization is carried out in the presence of a nitrogen-containing organic polar solvent such as N-methylpyrrolidone, N,N-dimethylformamide and N,N-dimethylacetamide. The reaction should be carried out under substantially anhydrous conditions and at a temperature below about 150° C. Most advantageously, the reaction is carried out from about 20° C. to about 50° C.

The reaction time is not critical and depends primarily on the reaction temperature. It may vary from about 1 to about 24 hours, with about 2 to about 4 hours at about 30° C. to about 50° C. preferred for the nitrogen-containing solvents.

Other amide-imide copolymers suitable for alloying with an aromatic sulfone polymer to extrude thin films include the following copolymers which comprise recurring polyamide A units of:

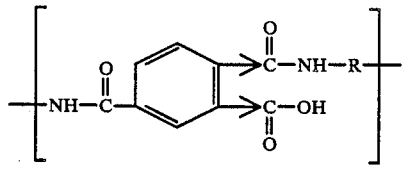

which are capable of undergoing imidization, and polyamide B units of:

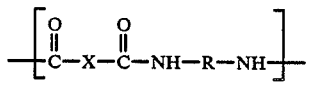

wherein the molar ratio of A units to B units is about 80 to about 20 to about 20 to about 80, preferably about 1 to about 1 and wherein R is a divalent aromatic hydrocarbon radical of from about 6 to about 20 carbon atoms or two divalent hydrocarbons joined directly or by stable linkages selected from the group consisting of —O—, methylene, —CO—, —SO$_2$—, and wherein X is a divalent aromatic radical and → denotes isomerization.

In the extruded film form, the polyamide A units have converted to the polyamide-imide A' units and the copolymer comprises recurring polyamide-imide A' units of:

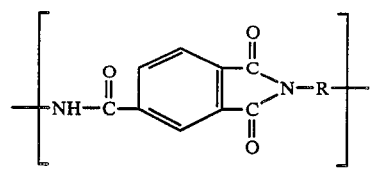

and polyamide B units of:

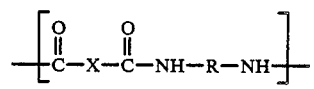

wherein the molar ratio of A' to B units is about 80 to about 20 to about 20 to about 80, preferably about 1 to about 1, and wherein R and X are defined as above.

The copolymers of this invention are prepared from acyl halide derivatives of dicarboxylic acid such as isophthalic acid or terephthalic acid and an ahydride-containing substance and aromatic diamines. Useful acyl halide derivatives of dicarboxylic acid include:

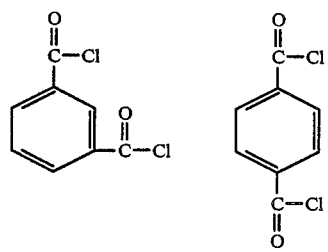

and related compounds. Suitably, the anhydride-containing substance is an acyl halide derivative of the acid anhydride having a single benzene or lower alkyl substituted benzene ring. The preferred anhydride is the four acid chloride of trimellitic anhydride (4-TMAC).

Useful aromatic diamines include para- and meta-phenylenediamine, oxybis (aniline), thiobis (aniline), sulfonylbis (aniline), and diaminobenzophenone, methylenebis (aniline), benzidine, 1,5-diaminonaphthalene, oxybis (2-methylaniline), thiobis (2-methylaniline), and the like. Examples of other useful aromatic primary diamines are set out in U.S. Pat. No. 3,494,890 (1970) and U.S. Pat. No. 4,016,140 (1977) both incorporated herein by reference. The preferred diamine is meta-phenylenediamine.

The copolymers of this invention can be prepared by reacting a mixture of an acyl halide derivative of an aromatic tricarboxylic acid anhydride and acyl halide derivatives of aromatic dicarboxylic acid with aromatic diamines.

Cavity pressure measurements are used as quality control checks of polyamide-imide resin viscosity. Pressure buildup during the filling of an injection molded part is measured at a point in the cavity (ejector pin). This is accomplished by placing a pressure transducer behind the ejector pin and recording the pressure with a chart recorder or other readout device. Cavity pressure normally rises as the mold is being filled and peaks as the molten resin is packed into the cavity. As the resin solidifies, cavity pressure decreases.

We have found that resins that have low cavity pressure process poorly and that spiral flow measurements were not sensitive enough to discriminate between resins in the viscosity range of interest. Low cavity pressures indicate a large pressure drop between injection and cavity pressures. This indicates higher resin viscosities. In the same manner, high cavity pressures indicate less pressure change between injection and cavity pressures, suggesting lower resin viscosities.

Amide-imide polymer and copolymer viscosities have been measured by spiral flow determinations previous to the implementation of the cavity pressure procedure, see U.S. Pat. No. 4,224,214. Cavity pressure was selected over spiral flow because of its greater sensitivity. The cavity pressure test has been implemented as an amide-imide homopolymer and copolymer quality control procedure. Like spiral flow, cavity pressure is a test that can be done conveniently in a molder's shop.

The injection molding machine was equipped with a horizontally mounted thermoset screw and barrel assembly. The mold was heated with hot oil from a Mokon Model 105-057 heating unit. Cavity pressure was recorded with a Control Process Model 241 recorder. The mold was equipped to handle pressure transducers at the ejector pins located at the gate end of the tensile bar and the gate end of the flex bar before we began our work. Since it was desirable to make cavity pressure measurements at the dead end of the flex bar, it was necessary to make some modifications in the mold base to accommodate a transducer at this pin position.

Resins were dried in a desiccant hot air circulating oven at 300° F. for at least 16 hours before testing. Moisture in amide-imide homopolymer copolymers has a very significant effect on their flow properties. Therefore, special care was taken to be sure the samples were properly dried. This drying procedure was used before making flow rate and cavity pressure measurements. The injection molding conditions are given in Table 1.

The flow rate procedure was patterned after the standard method described in ASTM D1238. A 335° C. (635° F.) barrel temperature with a 30 minute preheat time was used. This is about the largest set of weights that can be used safely with the standard extrusion plastometer apparatus. A standard 0.0825 in. diameter, and a 0.315 in. long orifice was used.

Special care was taken to be sure that each flow rate measurement was started when an equivalent volume of resin was in the barrel. Previous rheology work indicated that there is a very large "barrel height" effect on amide-imide homopolymers and copolymers. Each flow rate measurement was initiated while the top of the piston collar was between the two scribe marks on the piston. This precaution is also required by ASTM in method D1238.

TABLE 1

| | Set Points |
|---|---|
| Cylinder temperatures (°F.) | |
| Nozzle | 630–670 |
| Front zone | 630–670 |
| Rear zone | 620–660 |
| Timer (seconds) | |
| Clamp closed (cure) | 18 |
| Injection hold | 6 |
| Booster (inj. hi) | 2 |
| Cycle delay (open) | 1 |
| High-Low | 2 |
| Injection pressure (psi) | |
| High | 20,000 |
| Low | 10,000 |
| Machine settings | |
| Clamp pressure (tons) | Max |
| Injection rate | Max |
| Screw RPM | 50 |
| Feed setting | As Required |
| Cushion | ¼" |
| Back pressure (psi) | 220 |
| Mold temperature (°F.) | |
| Stationary | 450 |
| Movable | 450 |
| Hopper drier | 220 |

The mechanical and thermal properties of polyamide-imides containing polyethersulfone, polysulfone and polyarylsulfone are excellent, as shown in Table 2. For comparative purposes, the samples have been injection molded under the conditions reported in Table 1. The PAI (prepared as in Example II) blends with PES were molded at temperatures between 650° F. and 670° F. At blend levels above 50 percent by polymer weight of polyethersulfone, molded specimens could not be cured at the preferred 500° F. cure temperature without distorting.

The following examples illustrate the preferred embodiment of the invention. It will be understood that the examples are for illustrative purposes only and do not purport to be wholly definitive with respect to conditions or scope of the invention.

TABLE 2

| % Polyamide-imide | | | |
|---|---|---|---|
| Prepared as shown in Example I | 100 | 80 | 70 |
| Prepared as shown in Example II | — | — | — |
| % Polyethersulfone | | | |
| Victrex 600P | 0 | 20 | 30 |
| Victrex 200P | — | — | — |
| % Polysulfone (Udel P1700) | — | — | — |
| % Polyarylsulfone (Radel A-400) | — | — | — |
| Cavity Pressure PSI | 12,600 | 16,000 | 16,000 |
| Total Shrinkage mils/in. | 8.0 | 9.3 | 10.1 |
| Physical Properties | | | |
| Tensile Strength × $10^3$ PSI | 27.1 | 22.8 | 20.0 |
| Tensile Elongation % | 17.1 | 22.8 | 21.6 |
| Flexural Strength × $10^3$ PSI | 29.3 | 26.6 | 27.8 |
| Flexural Modulus $10^6$ PSI | .69 | .61 | .60 |
| Izod Impact, Notched Ft-lbs/in | 2.5 | 3.2 | — |
| Dart Impact in-lbs | 20.4 | 126.7 | 101.8 |
| Thermal Properties | | | |
| HDT, °F. | 529 | 528 | 522 |
| Flexural Strength × $10^3$ PSI | | | |
| @ 275° F. | 26.2 | 23.4 | — |
| @ 400° F. | 20.1 | 17.4 | 15.0 |
| @ 500° F. | 11.7 | 6.6 | — |
| Thermal Aging Properties | | | |
| Tensile Strength × $10^3$ PSI | | | |
| After 500 hrs @ 500° F. | 28.2 | 22.4 | — |
| After 1000 hrs @ 500° F. | 28.0 | 22.5 | — |
| HDT, °F. | | | |
| After 500 hrs @ 500° F. | 554 | 541 | — |
| After 1000 hrs @ 500° F. | 557 | 542 | — |
| Flexural Modulus × $10^6$ PSI | | | |
| After 500 hrs @ 500° F. | .79 | .70 | — |
| After 1000 hrs @ 500° F. | .77 | .73 | — |
| % Polyamide-imide | | | |
| Prepared as shown in Example I | 50 | 30 | 0 |
| Prepared as shown in Example II | — | — | — |
| % Polyethersulfone | | | |
| Victrex 600P | 50 | 70 | 100 |
| Victrex 200P | — | — | — |

TABLE 2-continued

| | | | |
|---|---|---|---|
| % Polysulfone (Udel P1700) | — | — | — |
| % Polyarylsulfone (Radel A-400) | — | — | — |
| Cavity Pressure PSI | 17,700 | 17,000 | 19,600 |
| Total Shrinkage mils/in. | 15.7 | * | 8.0** |
| Physical Properties | | | |
| Tensile Strength × 10³ PSI | 16.5 | — | 14.3 |
| Tensile Elongation % | 9.4 | — | 27.9 |
| Flexural Strength × 10³ PSI | 24.4 | — | 23.0 |
| Flexural Modulus 10⁶ PSI | .50 | — | .43 |
| Izod Impact, Notched Ft-lbs/in | 1.0 | — | 1.5 |
| Dart Impact in-lbs | — | — | — |
| Thermal Properties HDT, °F. | — | — | 422 |
| Flexural Strength × 10³ PSI | | | |
| @ 275° F. | — | — | 17.1 |
| @ 400° F. | — | — | 10.3 |
| @ 500° F. | — | — | 0 @ 450° F. |
| Thermal Aging Properties | | | |
| Tensile Strength × 10³ PSI | | | |
| After 500 hrs @ 500° F. | — | — | — |
| After 1000 hrs @ 500° F. | — | — | — |
| HDT, °F. | | | |
| After 500 hrs @ 500° F. | — | — | — |
| After 1000 hrs @ 500° F. | — | — | — |
| Flexural Modulus × 10⁶ PSI | | | |
| After 500 hrs @ 500° F. | — | — | — |
| After 1000 hrs @ 500° F. | — | — | — |
| % Polyamide-imide | | | |
| Prepared as shown in Example I | 100 | 80 | 0 |
| Prepared as shown in Example II | — | — | — |
| Polyethersulfone | | | |
| Victrex 600P | — | — | — |
| Victrex 200P | 0 | 20 | 100 |
| % Polysulfone (Udel P1700) | — | — | — |
| % Polyarylsulfone (Radel A-400) | — | — | — |
| Cavity Pressure PSI | 12,700 | 16,400 | 20,000 |
| Total Shrinkage mils/in. | 8.0 | 8.0 | — |
| Physical Properties | | | |
| Tensile Strength × 10³ PSI | 27.9 | 21.7 | 13.7 |
| Tensile Elongation % | 14.1 | 10.2 | 47.9 |
| Flexural Strength × 10³ PSI | 34.8 | 29.2 | 22.7 |
| Flexural Modulus 10⁶ PSI | .74 | .620 | .425 |
| Izod Impact, Notched Ft-lbs/in | 2.54 | 1.80 | 1.1 |
| Dart Impact in-lbs | | | |
| Thermal Properties HDT, °F. | 528 | 525 | 432 |
| Flexural Strength × 10³ PSI | | | |
| @ 275° F. | — | — | — |
| @ 400° F. | 19.8 | 16.2 | 7.0 |
| @ 500° F. | — | — | — |
| Thermal Aging Properties | | | |
| Tensile Strength × 10³ PSI | | | |
| After 500 hrs @ 500° F. | — | — | — |
| After 1000 hrs @ 500° F. | — | — | — |
| HDT, °F. | | | |
| After 500 hrs @ 500° F. | — | — | — |
| After 1000 hrs @ 500° F. | — | — | — |
| Flexural Modulus × 10⁶ PSI | | | |
| After 500 hrs @ 500° F. | — | — | — |
| After 1000 hrs @ 500° F. | — | — | — |
| % Polyamide-imide | | | |
| Prepared as shown in Example I | 80 | 70 | 0 |
| Prepared as shown in Example II | — | — | — |
| % Polyethersulfone | | | |
| Victrex 600P | — | — | — |
| Victrex 200P | — | — | — |
| % Polysulfone (Udel P1700) | 20 | 30 | 100 |
| % Polyarylsulfone (Radel A-400) | — | — | — |
| Cavity Pressure PSI | 19,700 | 20,000 | 20,000 |
| Total Shrinkage mils/in. | 7.4 | 7.7 | NR |
| Physical Properties | | | |
| Tensile Strength × 10³ PSI | 19.8 | 17.7 | 9.9 |
| Tensile Elongation % | 12.1 | 10.3 | 84.9 |
| Flexural Strength × 10³ PSI | 28.3 | 26.3 | 17.3 |
| Flexural Modulus 10⁶ PSI | .591 | .561 | .395 |
| Izod Impact, Notched Ft-lbs/in | 1.0 | 1.62 | 1.82 |
| Dart Impact in-lbs | — | — | — |
| Thermal Properties HDT, °F. | 533 | 520 | 326 |
| Flexural Strength × 10³ PSI | | | |
| @ 275° F. | — | — | — |
| @ 400° F. | 9.7 | 6.2 | 0 |
| @ 500° F. | — | — | — |
| Thermal Aging Properties | | | |
| Tensile Strength × 10³ PSI | | | |
| After 500 hrs @ 500° F. | — | — | — |
| After 1000 hrs @ 500° F. | — | — | — |
| HDT, °F. | | | |
| After 500 hrs @ 500° F. | — | — | — |
| After 1000 hrs @ 500° F. | — | — | — |
| Flexural Modulus × 10⁶ PSI | | | |
| After 500 hrs @ 500° F. | — | — | — |
| After 1000 hrs @ 500° F. | — | — | — |
| % Polyamide-imide | | | |
| Prepared as shown in Example I | — | — | — |
| Prepared as shown in Example II | 100 | 80 | 70 |
| % Polyethersulfone | | | |
| Victrex 600P | — | 20 | 30 |
| Victrex 200P | — | — | — |
| % Polysulfone (Udel P1700) | — | — | — |
| % Polyarylsulfone (Radel A-400) | — | — | — |
| Cavity Pressure PSI | 13,700 | 14,800 | 16,100 |
| Total Shrinkage mils/in. | 7.7 | 8.4 | 8.4 |
| Physical Properties | | | |
| Tensile Strength × 10³ PSI | 16.8 | 24.6 | 20.9 |
| Tensile Elongation % | 5.8 | 10.9 | 9.4 |
| Flexural Strength × 10³ PSI | 33.7 | 33.3 | 30.8 |
| Flexural Modulus 10⁶ PSI | 0.84 | 0.64 | 0.58 |
| Izod Impact, Notched Ft-lbs/in | 0.3 | 1.20 | 1.0 |
| Dart Impact in-lbs | <2.0 | 21.4 | — |
| Thermal Properties HDT, °F. | 552 | 557 | 552 |
| Flexural Strength × 10³ PSI | | | |
| @ 275° F. | 26.9 | 28.4 | 22.9 |
| @ 400° F. | 24.8 | 22.3 | 18.4 |
| @ 500° F. | 15.6 | 8.1 | 2.7 |
| Thermal Aging Properties | | | |
| Tensile Strength × 10³ PSI | | | |
| After 500 hrs @ 500° F. | — | 23.9 | 20.8 |
| After 1000 hrs @ 500° F. | — | 22.0 | 19.1 |
| HDT, °F. | | | |
| After 500 hrs @ 500° F. | — | 573 | 554 |
| After 1000 hrs @ 500° F. | — | 576 | 564 |
| Flexural Modulus × 10⁶ PSI | | | |
| After 500 hrs @ 500° F. | — | .61 | .55 |
| After 1000 hrs @ 500° F. | — | .58 | .54 |
| % Polyamide-imide | | | |
| Prepared as shown in Example I | — | — | — |
| Prepared as shown in Example II | 0 | 90 | 80 | 0 |
| % Polyethersulfone | | | |
| Victrex 600P | 100 | — | — |
| Victrex 200P | — | — | — |
| % Polysulfone (Udel P1700) | — | — | — |
| % Polyarylsulfone (Radel A-400) | — | 10 | 20 | 100 |
| Cavity Pressure PSI | 19,600 | 19,100 | 20,300 | — |
| Total Shrinkage mils/in. | — | 10.0 | 10.4 | — |
| Physical Properties | | | |
| Tensile Strength × 10³ PSI | 14.3 | 19.4 | 21.6 | — |
| Tensile Elongation % | 27.9 | 7.5 | 10.4 | — |
| Flexural Strength × 10³ PSI | 23.0 | 34.4 | 33.2 | — |
| Flexural Modulus 10⁶ PSI | 0.43 | 0.65 | 0.61 | — |
| Izod Impact, Notched Ft-lbs/in | 1.5 | 0.9 | 1.4 | — |
| Dart Impact in-lbs | | | | |
| Thermal Properties HDT, °F. | 422 | 560 | 560 | — |
| Flexural Strength × 10³ PSI | | | |
| @ 275° F. | 17.1 | — | — | — |

TABLE 2-continued

| | | | | |
|---|---|---|---|---|
| @ 400° F. | 10.3 | — | — | — |
| @ 500° F. | 0 @ 450° F. | — | — | — |
| Thermal Aging Properties Tensile Strength × 10³ PSI | | | | |
| After 500 hrs @ 500° F. | — | — | — | — |
| After 1000 hrs @ 500° F. | — | — | — | — |
| HDT, °F. | | | | |
| After 500 hrs @ 500° F. | — | — | — | — |
| After 1000 hrs @ 500° F. | — | — | — | — |
| Flexural Modulus × 10⁶ PSI | | | | |
| After 500 hrs @ 500° F. | — | — | — | — |
| After 1000 hrs @ 500° F. | — | — | — | — |

Note: All samples from PAI prepared as in Example II have been cured at temperatures up to 515° F. All samples from PAI prepared as in Example I were cured @ 500° F.
*Parts distorted during curing @ 500° F.
**Parts annealed @ 400° F. for 4 hrs.

EXAMPLE I

A 200 ml, round-bottom, 4-neck flask, equipped with a nitrogen inlet tube, stirrer, thermometer, and solids addition funnel, was charged with 99.9 parts by weight of (pbw) p,p'-oxybis(aniline) (OBA), 23.1 pbw metaphenylenediamine (MPDA) and 604 pbw N-methylpyrrolidone (NMP). When solution at room temperature (72° F.) was complete, 142.5 pbw 4-trimellitoyl anhydride chloride (4-TMAC), having a percent purity of 99.5 percent ±0.5 percent as determined from chloride content of 6.8 pbw of trimellitic acid anhydride (TMA) was added over 2.5 hours while maintaining a solution temperature of between 77°–95° F. When addition was complete, the solution was stirred for 3 hours during which time the solution viscosity increased to a Gardner-Holdt value of Z5 or about 110 poises.

Solid polymer was obtained by first pouring the viscous solution into twice its volume of distilled water in a Waring blender and then filtering. The filtrate was washed with 5 increments of 3000 pbw each of distilled water to remove hydrogen chloride that had been generated during reaction.

The solid was dried under a vacuum of 20 inches of mercury for 24 hours at 122° F. The above material was heated for 2 hours in an oven set at 450° F. to give the final product.

EXAMPLE II

A 10-gal., glass-lined Pfaudler kettle equipped with a water-cooled jacket and nitrogen inlet was charged with 9.87 lbs. of m-phenylenediamine, 0.35 lb. of trimellitic anhydride and 59.2 lbs. of N-methylpyrrolidone. After solution had occurred under a nitrogen purge, an intimate blend of 9.52 lbs. of 4-trimellitoyl anhydride chloride and 9.17 lbs. of isophthaloyl dichloride was added over 2.5 hrs. keeping the temperature below 35° C. The resulting viscous solution was brought to 50° C. When the Gardner viscosity had reached a Z3 viscosity the solution was precipitated by passage through a Fitzpatrick comminuting mill. The polymer product was washed five times with deionized water followed by air-drying on a filter for 3 days. The product was then brought to a solids content of 98.3 percent by heating in a forced-air oven for 2 hrs. at 470° C.

EXAMPLE III

Metaphenylenediamine (540 g) and acetic acid (900 ml) were placed in a five-liter, three-necked, round bottom flask equipped with mechanical stirrer, pressure equalizing addition funnel, nitrogen sparge tube, distillation head and condenser. The nitrogen sparge was set at 300 cc/min and 765 g of acetic anhydride was added over 5 min. This was followed by the addition of 415 g of isphthalic acid and 480 g of trimellitic anhydride. The temperature of the bottom half of the spherical heating mantle surrounding the flask was set at 700° F. and the top half of the mantle was heated with a Variac set at 50. After 105 min, 1730 ml of distillate was collected and the polymer had become very viscous. The heat was turned off and the polymer was cooled under nitrogen.

EXAMPLE IV

A 690 g portion of dimethylacetamide was stirred and cooled to 5° C. with dry nitrogen purging to keep the system dry. An intimate mixture composed of 252.2 g of 4-TMAC, 119.0 g of p',p-methylene-bis(aniline), and 120.0 g of p,p'-oxybis(aniline) was then added to the solvent for a period of 30 minutes. The temperature of the reaction was allowed to rise to 50° C. At that temperature it was controlled by means of an ice bath. An additional 100 g of DMAC were then added to wash in all solids, and the reaction continued for another 3½ hours at 50° C. The reaction solution was then poured into a large excess of rapidly-agitated water, whereupon precipitation of the copolymer took place. The solids were then washed several times with distilled water and soaked overnight. Finally, the solids were dried at 120° F. A 443 g yield of the copolymer was obtained.

EXAMPLE V

A solution consisting of 533.3 g of NMP, 300 g of DMAC, and 58.0 g of propylene oxide was stirred and cooled to 8° C. A mixture of 168.5 g of 4-TMAC, 80.1 g of OBA, and 79.3 g of MBA was then added to the solvent over a period of 50 minutes. During this time, the reaction was allowed to warm to 36° C. An additional 66.7 g of NMP were added to wash in all solids, then the reaction mixture was heated to 50° C. and held at that temperature for 3½ hours. The solution was then filtered.

EXAMPLE VI

The general procedure for preparing a copolymer containing three diamines is illustrated by the reaction of OBA, MPDA and MBA and 4-TMAC in DMAC. Thus, a 242.0 g portion of OBA (1.21 moles), a 130.7 g portion of MPDA (1.21 moles) and a 239.6 g portion of MBA (1.21 moles) were dissolved in 3900 g DMAC contained in a 6-liter flask equipped with a nitrogen purge, stirrer, addition funnel and thermometer. A 765 g portion of 4-TMAC (3.63 moles) in flake or lump form was then added to the solution in portions over 90 minutes. The reaction exotherm was allowed to raise the temperature to about 35° C. The reaction temperature was maintained at 33°–38° C. for the remainder of the 4-TMAC addition using cooling water when necessary. After the TMAC addition was completed, any residual TMAC clinging to the addition funnel was completely washed into the reaction solution with 70 g DMAC. A heating mantle was applied to the reaction flask and the temperature quickly rose (about 20 min.) to 50° C. The reaction solution was stirred at 50° C. for 90 minutes and then the solution was precipitated by admixing with water. Prior to precipitation, the solution viscosity was about 7.5 stokes (25° C., 20 percent solids). The polymer was precipitated in distilled water in a model D, W. J. Fitzpatrick Company, comminuting machine (Fitz mill). After precipitation, the polymer was washed with distilled water to aqueous pH 4 to 5 (3 to 4 hours washing time), then filtered onto large Buchner funnels. The polymer was dried overnight by drawing air through the funnels, then finally dried in an aeromat drier at 30°–35° C. for 12–15 hours.

EXAMPLE VII

Neat amide-imide polyethersulfone blends can be prepared by physically blending the constituents together, either pellet to pellet, powder to powder, powder to pellet, or pellet to powder, with or without a compounding step prior to film extrusion. It is preferred that the constituents are melt compounded. However, favorable results can be achieved without melt compounding.

EXAMPLE VIII

Melt compounded samples of 70/30, 50/50, and 30/70 blends of a polyamide-imide/polyethersulfone were fabricated into films, ribbons and sheets in a single-screw ¾ inch Brabender extruder. The ¾ inch Brabender screw can range in L/D ratio from 8:1 to 26:1 and the compression ratio can range from ~3:1 to 1:1. The preferred screw has a L/D ratio greater than 20:1 and a compression ratio equal to or less than 1.5:1. A conventional polyolefin coathanger die was used. However, it is not the preferred die design.

Melt compounded blends of 90/10 and 80/20 polyamide-imide/polyethersulfone were fabricated into thin films on a Werner Pfleider twin-screw extruder. Films can be made using conventional polyolefin coathanger die but the preferred design is a modified rigid PVC die.

EXAMPLE IX

Polyamide-imides are high melt viscosity polymers with limited melt ductility characteristics which makes them extremely difficult to cast into a film via conventional film extrusion methods. The addition of up to 50 percent by polymer weight of polyethersulfone drastically increases the melt ductility of the PAI and reduces the PAI melt viscosity, thus allowing a thinner film to be drawn. This increase in melt ductility can be illustrated by comparing the melt drawability of a hot injection molded purge of a 50/50 blend of a polyamide-imide/polyethersulfone prepared according to the procedure in Example I with that of a conventional polyamide-imide purge as prepared according to the procedure in Example I. A hot 50/50 blend purge can be drawn an arm's length without breaking while the polyamide-imide could only be drawn a couple of inches. This illustrates the dramatic enhancement of the polyamide-imide melt ductility via alloying with polyethersulfone. This enhancement in melt ductility allows the blend to be drawn into a thin film.

EXAMPLE X

When a polyamide-imide copolymer, prepared according to the procedure in Example 1, was alloyed with 70 percent by polymer weight of polyethersulfone a homogeneous 15 mil ribbon was extruded which had good resilience and no signs of delamination. The ribbon was prepared on a Brabender single-screw extruder equipped with a conventional polyolefin-type die. The screw had an 8:1 L/D ratio at a 1:1 compression ratio. The 70 percent PES/30 percent PAI ribbon did not have the heat resilience to withstand the 500° F. cure temperature. A ribbon made from a 50/50 blend could be cured without distortion. A 100 percent polyamide-imide could not be extruded into a film due to its high melt viscosity resulting in extremely high pressure. Each time the 100 percent PAI was extruded, the drive torque exceeded 100 N-M resulting in the breakup of the extruder shear pin. Under the above conditions, a 100 percent polyamide-imide ribbon could not be extruded. The PAI/PES alloy ribbon could be stressed without scattering which suggests the material is not as brittle as a polyamide-imide. The alloy film resilience allowed cold die punching without scattering.

EXAMPLE XI

A 30 mil sheet was prepared from a physical blend of 50 percent PAI prepared according to the procedure in Example I and 50 percent PES (Victrex 600P) on a Brabender cast film line using a 6 inch coathanger die, designed for polyolefin film, with a 67 mil die gap. A 7-day cure cycle with 3 days at 500° produced a very resilient sheet which could be stressed 180° (back and forth) several times before tearing. The ribbon fractures were ductile in nature, uncharacteristic of PAI which are extremely brittle. Test samples were die cut parallel and perpendicular to flow. In the machine direction, the ribbon had a 26 percent break elongation, a 12,000 PSI tensile strength and a 410,000 PSI tensile modulus. In the transverse direction, the break elongation was 16 percent, the tensile strength was 10,600 PSI and the tensile modulus was 360,000 PSI. Gardner impact resistance of the sheet was 45 in-lbs.

EXAMPLE XII

A 50 percent PAI was prepared according to the procedure in Example I and 50 percent PES (Victrex 600P) blend was initially melt compounded on a ZSK-30 twin screw extruder and then cast into a variety of extrudates, on the Brabender single screw extruder, ranging from a 60 mil sheet to a 9 mil film. The melt was very ductile and could be drawn readily by increasing the take-off speed. The 9 mil film underwent a 4:1 drawdown which resulted in a highly oriented film. The 9 mil film was fairly resilient in the transverse direction but brittle in the machine direction resulting in poor tear properties. The ribbon properties are very anisotropic with MD tensile strengths and elongations of 15,200 PSI and 39.3%, respectively.

When compared to the physical blended alloy (Example XI), the melt compounded 50/50 ribbon was more brittle. Photomicrographs revealed the physical blend ribbon had alternating layers of PAI and PES while the melt compounded ribbon was homogeneous. These alternating layers of PES may give the ribbon its toughness properties and fatigue resistance but lower its tensile strength.

EXAMPLE XIII

An undrawn monofilament was prepared from a 50/50 melt blend of PAI prepared according to the procedure in Example I. The blend ran fairly well on a 1 inch polypropylene monofilament extrusion line. However, the filaments were not highly oriented. The melt had good drawn down characteristics, but once quenched the monofilament could not be re-heated and drawn (oriented) to a finer denier. The undrawn monofilament denier was 1670 while its tenacity was 0.67 grams per denier with a 6 percent elongation. A sample was cured at 500° F. However, the properties were unchanged. A 100 percent PAI was not extruded into a similar monofilament due to the excessive head pressure that would occur from the high melt viscosity of the PAI. The addition of up to 50 percent PES reduces the PAI melt viscosity and drastically increases the melt ductility thus producing an alloy with improved processing characteristics.

EXAMPLE XIV

Two PAI/PES alloys, both of an 80/20 composition, were extruded into 5 mil and 10 mil film in a Werner Pfleider ZSK-30 twin screw extruder. Both alloys contained 20 percent by polymer weight of PES (Victrex 600P). One alloy contained 80 percent PAI prepared according to the procedure of Example I, the other alloy contained 80 percent PAI prepared according to the procedure Example II. Each alloy extruded well into a 6 inch wide film. However, the PAI alloy prepared as shown in Example II exhibited much more melt ductility which resulted in a smoother film edge. This increase in melt ductility with the PAI prepared as shown in Example II has a major advantage enabling us to prepare finer gauge films without tearing. This again illustrates that not all PAI alloys behave similarly even though the same secondary polymer (Victrex 600P) is used in the alloy.

The physical properties of the two PAI alloys are compared to a solvent cast polyimide film (DuPont Kapton) in Table III. The addition of up to 20 percent PES improves the impact resistance of PAI's as illustrated in Table 2. As expected with an extruded film, the MD properties are superior to the TD properties. However, the differences, which are only marginal, indicate good isotropic characteristics. The best PAI alloy properties are found in the 5 mil PAI/PES alloy whereby the PAI was prepared as shown in Example II. These properties compare favorably to the much more expensive cast polyimide film.

TABLE 3

| PAI/PES Film Properties | | | |
|---|---|---|---|
| | Kapton* Film | Example I Prepared PAI + 20% PES | Example II Prepared PAI + 20% PES |
| Film Thickness | 3 mils | 10 mils | 10 mils | 5 mil |
| MD Tensile Properties | | | | |
| Strength × 10³ psi | | | | |
| Extruded | 21.6(cast) | 16.8 | 15.1 | 16.8 |
| Cured @ 500° F. | | 16.9 | 17.5 | 18.4 |
| Cured @ 515° F. | | | 17.6 | 17.7 |
| Elongation, % | | | | |
| Extruded | 38.6(cast) | 36.2 | 27.5 | 34.2 |
| Cured @ 500° F. | | 26.5 | 33.5 | 29.3 |
| Cured @ 515° F. | | | 28.6 | 38.2 |
| Modulus × 10⁶ psi | | | | |
| Extruded | .425(cast) | .446 | .466 | .443 |
| Cured @ 500° F. | | .507 | .547 | .639 |
| Cured @ 515° F. | | | .488 | .432 |
| TD Properties (Tensile) | | | | |
| Strength × 10³ psi | | | | |
| Extruded | | 14.1 | 14.6 | 13.5 |
| Cured @ 500° F. | | 15.5 | 16.6 | 15.3 |
| Cured @ 515° F. | | | 15.7 | 15.6 |
| Elongation % | | | | |
| Extruded | | 17.1 | 42.9 | 19.2 |
| Cured @ 500° F. | | 25.8 | 18.1 | 17.0 |
| Cured @ 515° F. | | | 19.2 | 21.0 |
| Modulus × 10⁶ psi | | | | |
| Extruded | | .420 | .436 | .380 |
| Cured @ 500° F. | | .505 | .502 | .511 |

TABLE 3-continued

| PAI/PES Film Properties | | |
|---|---|---|
| | Kapton* Film | Example I Prepared PAI + 20% PES | Example II Prepared PAI + 20% PES |
| Cured @ 515° F. | | .484 | .409 |

*Solvent cast polyimide film
Note: Each material has at least 0.5 percent PTFE addded.

EXAMPLE XV

An 80/20 and 90/10 alloy of PAI/PES blend prepared as shown in Example II have been extruded on a Werner Pfleider ZSR-30 twin-screw extruder into a 6 inch wide film with thickness ranging from 1 mil to 10 mil. The drawdown ratio ranged from ~1:1 to 10:1 depending on take-off speed which ranged from 15 ft/min to over 40 ft/min. Samples of the various films were cured at 500° F. without any film distortion. The films were also cherry red and translucent.

I claim:

1. An extruded film having a thickness of about 0.5 to about 10 mils comprising about 0.1 to about 50 percent by weight of an aromatic sulfone polymer, and about 99.9 to about 50 percent by weight of an amide-imide phthalamide copolymer comprising recurring amide-imide units A:

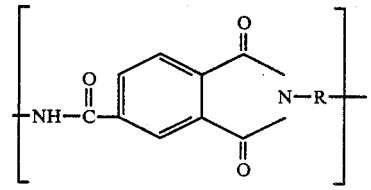

and recurring amide units B:

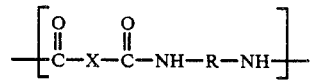

wherein the molar ratio of A to B units is about 80 to about 20 to about 20 to about 80, wherein R is a divalent aromatic hydrocarbon radical of from about 6 to about 20 carbon atoms or two divalent hydrocarbons joined directly or by stable linkages selected from the group consisting of —O—, methylene, —CO—, —SO₂— and X is a divalent aromatic radical.

2. The extruded film of claim 1 wherein the aromatic sulfone polymer is of the following repeating structure:

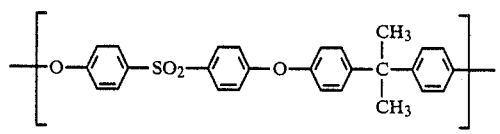

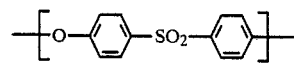

-continued

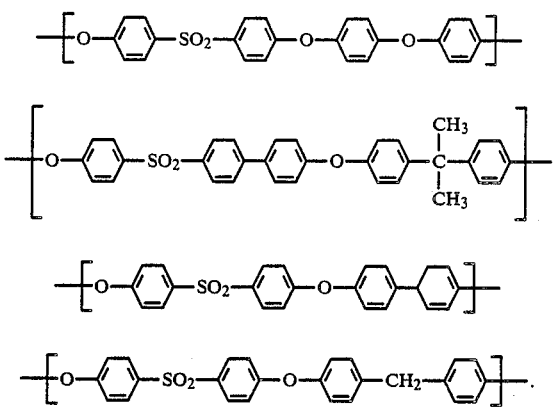

3. The extruded film of claim 1 wherein the molar ratio of A units to B units is about 1 to about 1.

4. The extruded film of claim 3 wherein the aromatic sulfone polymer comprises the following repeating structure:

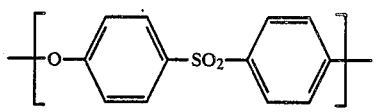

5. The extruded film of claim 4 wherein said amide-imide phthalamide copolymer comprises about 90 to about 70 percent by weight of said film, said aromatic sulfone polymer comprises about 10 to about 30 percent by weight of said film, and R and X are the same and have the following structure:

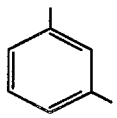

6. The extruded film of claim 4 wherein X and R are the same and have the following structure:

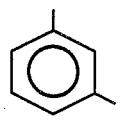

7. A process for forming an amide-imide phthalamide copolymer film with improved tensile properties which comprises forming a blend by combining (1) about 99.9 to about 50 percent by weight of an amide-imide phthalamide copolymer having recurring amide units A:

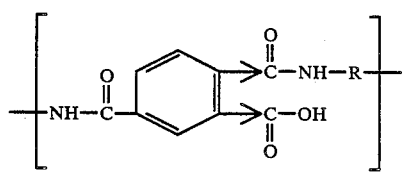

which are capable of undergoing imidization and recurring amide units B:

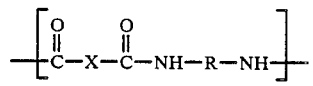

wherein the molar ratio of A units to B units is about 80 to about 20 to about 20 to about 80, wherein R is a divalent aromatic hydrocarbon radical of from about 6 to about 20 carbon atoms or two divalent hydrocarbons joined directly or by stable linkages selected from the group consisting —O—, methylene, —CO—, —SO₂—, and wherein X is a divalent aromatic radical and → denotes isomerization, and (2) about 0.1 to about 50 percent by weight of a polyethersulfone having the following repeating structure:

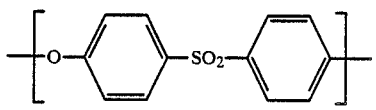

and extruding said blend to form a film having a thickness of about 0.5 to about 10 mils.

8. The process of claim 7 wherein the molar ratio of A units to B units is about 1 to about 1.

9. The process of claim 8 wherein said amide-imide phthalamide copolymer comprises about 90 to about 70 percent by weight of said blend, said polyethersulfone comprises about 10 to about 30 percent by weight of said blend, and R and X are the same and have the following structure:

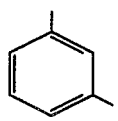

10. A process for forming an amide-imide phthalamide copolymer film with improved tensile properties which comprises forming a blend by combining (1) about 99.9 to about 50 percent by weight of an amide-imide phthalamide copolymer having recurring amide-imide units A:

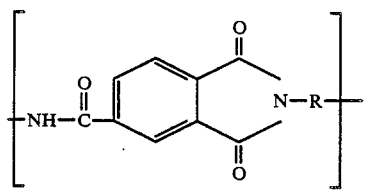

and recurring amide units B:

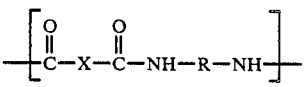

wherein the molar ratio of A units to B units is about 80 to about 20 to about 20 to about 80 wherein R is a divalent aromatic hydrocarbon radical of from about 6 to about 20 carbon atoms or two divalent hydrocarbons joined directly or by stable linkages selected from the group consisting of —O—, methylene, —CO—, —SO$_2$—, and wherein X is a divalent aromatic radical, and (2) about 0.1 to about 50 percent by weight of a polyethersulfone having the following repeating structure:

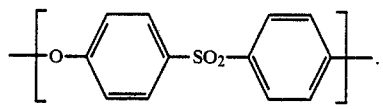

and extruding said blend to form a film having a thickness of about 0.5 to about 10 mils.

11. The process of claim 10 wherein the molar ratio of A units to B units is about 1 to about 1.

12. The process of claim 11 wherein said amide-imide phthalamide copolymer comprises about 90 to about 70 percent by weight of said blend, said polyethersulfone comprises about 10 to about 30 percent by weight of said blend, and R and X are the same and have the following structure:

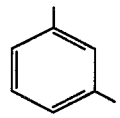

* * * * *